(12) United States Patent
Lee et al.

(10) Patent No.: US 9,489,996 B2
(45) Date of Patent: Nov. 8, 2016

(54) DATA PROCESSING APPARATUS AND METHOD

(71) Applicant: SK HYNIX INC., Icheon (KR)

(72) Inventors: Sang Eun Lee, Icheon (KR); Oung Sic Cho, Icheon (KR)

(73) Assignee: SK HYNIX INC., Icheon (KR)

( * ) Notice: Subject to any disclaimer, the term of this patent is extended or adjusted under 35 U.S.C. 154(b) by 205 days.

(21) Appl. No.: 14/252,479

(22) Filed: Apr. 14, 2014

(65) Prior Publication Data

US 2015/0155022 A1 Jun. 4, 2015

(30) Foreign Application Priority Data

Dec. 3, 2013 (KR) ........................ 10-2013-0149242

(51) Int. Cl.
*G11C 8/10* (2006.01)

(52) U.S. Cl.
CPC ...................................... *G11C 8/10* (2013.01)

(58) Field of Classification Search
None
See application file for complete search history.

(56) References Cited

U.S. PATENT DOCUMENTS

| | | | |
|---|---|---|---|
| 6,400,728 B1* | 6/2002 | Ott | H03M 13/09 370/310 |
| 2003/0112879 A1* | 6/2003 | Antia | H04L 1/0041 375/259 |
| 2008/0116933 A1 | 5/2008 | Ishiyama | |
| 2009/0161447 A1 | 6/2009 | Ha et al. | |
| 2014/0344650 A1* | 11/2014 | Au | G06F 11/10 714/776 |

FOREIGN PATENT DOCUMENTS

KR 10-2009-0066916 A 6/2009

* cited by examiner

*Primary Examiner* — Idriss N Alrobaye
*Assistant Examiner* — Dayton Lewis-Taylor (57) ABSTRACT

A data processing apparatus includes a controller configured to provide, using a unified connector, group data processing information for a processing operation of a data group processed based on the same data processing information. The data group comprises a plurality data transmitted or received through a plurality of connectors. An operation unit is configured to decode and/or encode the data group based on the group data processing information.

11 Claims, 5 Drawing Sheets

DATA PROCESSING APPARATUS AND METHOD

CROSS-REFERENCES TO RELATED APPLICATION

The present application claims priority to Korean Patent Application Number 10-2013-0149242, filed on Dec. 3, 2013, which is incorporated by reference herein in its entirety.

BACKGROUND

1. Technical Field

Embodiments of the present invention relates to a data processing apparatus and method, and more particularly, to a data processing apparatus and method which provide a plurality of data processing information through one connector.

2. Related Art

For increased speed and miniaturization of electronic apparatuses, data processing apparatuses have been designed to perform data processing at high speed and simultaneously to reduce a size. Further, power consumption is important in portable electronic apparatuses because it affects a total operating time or battery capacity of the electronic apparatuses, and therefore it may be desirable to reduce the power consumption of the data processing.

SUMMARY

One or more embodiments are provided of a data processing apparatus implemented with a small size by providing information for a data processing operation through one connector.

One or more embodiments are provided of a data processing method capable of improving operation flexibility by designating a connector which specifies the transfer characteristics of a plurality of data bytes that are supplied or received.

According to an aspect of an embodiment, there is a data processing apparatus. The data processing apparatus may include a controller that may provide, through a unified connector, group data processing information for a processing operation of a data group comprising data bytes transmitted/received through a plurality of connectors and processed based on the same data processing information, and an operation unit that may decode the data group based on the group data processing information.

For example, the controller may encode the data group and transmit the encoded data group to the operation unit. In some embodiments, the encoded data group may correspond to a first encoded data group, and the controller may further include a receiver configured to receive a second encoded data group through the plurality of connectors, and a decoder configured to decode the second encoded data group based on the connector allocation information and the group data processing information.

According to an aspect of an embodiment, there is a data processing method. The data processing method may include generating group data processing information for a processing operation of a data group comprising a plurality of data bytes transmitted/received through a plurality of connectors and processed based on the same data processing information, encoding the data group based on connector allocation information and the group data processing information, and transmitting the encoded data group through the plurality of connectors based on the connector allocation information and providing the group data processing information through a unified connector.

Embodiments are directed to a data processing apparatus and methods of operating the data processing apparatus, which are suitable for miniaturization and provide a plurality of data processing characteristic information through a unified connector.

Embodiments are directed to a data processing apparatus and methods of operating the data processing apparatus, which enable a flexible operation by providing, to a specific connector, data processing characteristic information that enable certain programs.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, embodiments will be described in detail with reference to the accompanying drawings.

Figure 1:
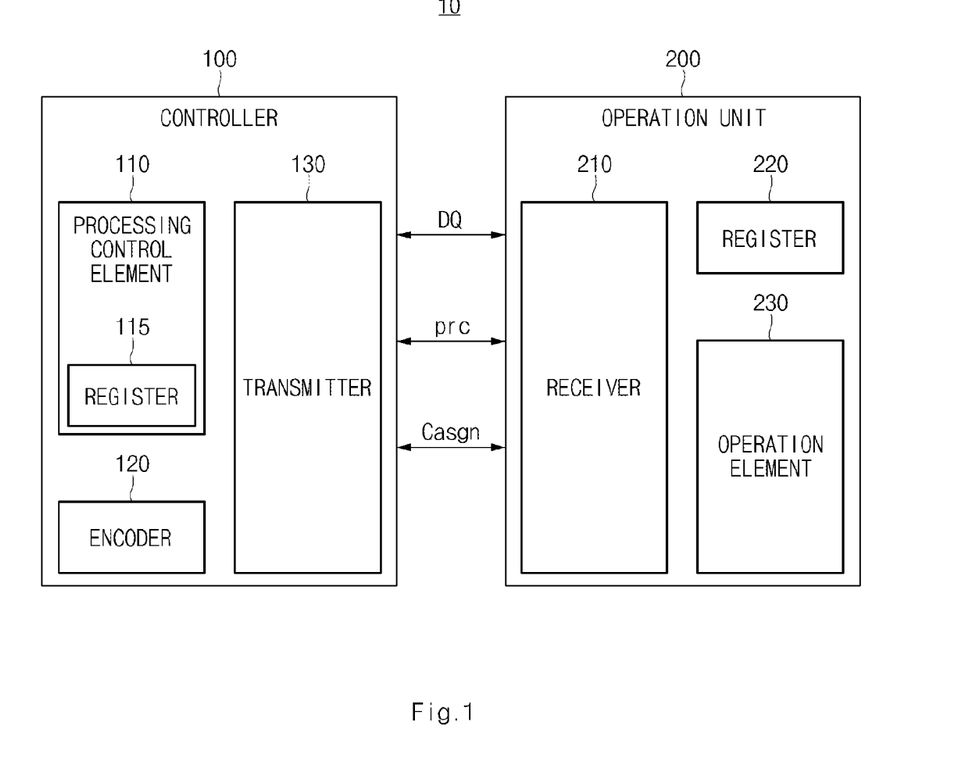
FIG. 1 is a block diagram illustrating a data processing apparatus according to an embodiment.

FIG. 1 is a block diagram illustrating a data processing apparatus 10 according to an embodiment. The data processing apparatus 10 includes a controller 100 and an operation unit 200.

In an embodiment, the controller 100 serves as a data transmitter and provides data DQ, data processing information prc, and connector allocation information Casgn to the operation unit 200 serving as a data receiver. The controller 100 may provide the data DQ to the operation unit 200 which may then store the data DQ, or may read out data DQ from the operation unit 200.

In an embodiment, the data DQ may include data bytes DQ1, DQ2, DQ3, . . . , DQn each being a byte (8 bits) unit. A characteristic of how each of the data bytes DQ1, DQ2, DQ3, . . . , DQn is processed may be provided as the data processing information prc. The data bytes DQ1, DQ2, DQ3, . . . , DQn and the data processing information prc will be described in detail with reference to FIG. 2.

For example, information concerning the method by which the first data byte DQ1 of 8 bits is processed may be included in the data processing information prc. At least one piece of data processing information prc may be provided with respect to each of the data bytes DQ1, DQ2, DQ3, . . . , DQn, and thus a connector that may provide the at least one piece of data processing information prc with respect to each of the data bytes is necessary.

In an embodiment, one piece of data processing information prc may be generated per one data byte DQ1, DQ2, DQ3, . . . , DQn, respectively, and thus for each data byte a first connector that may transmit the data and a second connector that may transmit the data processing information may be necessary.

Embodiments are herein described on the assumption that information concerning how the transmitted/received data has been processed or has to be processed is included in the data processing information prc.

In some embodiments, the data processing information prc may include information for processing operations of the plurality of data bytes DQ1, DQ2, DQ3, . . . , DQn. Herein, for convenience of description, the "data byte" is used as unit of transmission, reception, and information for processing operation, however, it is to be understood that the unit for such operation is not limited to the byte. The data processing information prc may include data masking (DM), data bus inversion (DBI), data strobe (DQS), or the like.

A first data processing operation may correspond to a data masking operation, and information about whether or not data masking is performed is included in the data processing information prc.

The data masking operation is used when data to be written has been previously written. In the data masking operation, information that data masking is performed is transmitted without transmitting the data, or a writing operation for the transmitted data is not performed by ignoring the transmitted data. In particular, the data masking operation is used when the operation unit 200 includes a memory, and the data to be written has the same value as data currently stored in the operation unit 200.

The data masking method may be advantageously used when large amounts of data remain unchanged during an overall operation of the data processing apparatus 10. An overall operation speed of the data processing apparatus 10 may be improved and power consumption of the data processing apparatus 10 may be reduced using the data masking method. The data masking operation may be performed by apparatuses implemented with various methods, and thus a detailed description thereof will be omitted.

A second data processing operation may correspond to a data bus inversion operation. The data bus inversion operation is a method which, when each data byte DQ1, DQ2, DQ, . . . , DQn of the data DQ transmits data of n bits or more (here, n is a natural number, for example, 8 bits when the data DQ is configured in byte units as described above), inverts the data DQ and transmits an inverting result when the number of bits corresponding to a first logic state 'HIGH' is larger than the number of bits corresponding to a second logic state 'LOW'.

When the bits constituting the data DQ correspond to the first logic state 'HIGH', the power consumption for transmission of the data group DQ may be large. Therefore, when the data bus inversion method is used for such a case, the power consumption may be reduced. The data bus inversion method may be performed by apparatuses implemented with various methods, and thus a detailed description thereof will be omitted. Also, a person of skill in the art based on the teachings and disclosures herein would understand that other criteria for transmitting an inverting result, such as when the number of bits corresponding to the second logic state 'LOW' is larger than the number of bits corresponding to the first logic state 'HIGH' if the power consumption for transmission is large for the second logic state 'LOW' state, may be used.

A third data processing operation is a method which strobes data according to a data strobe signal DQS, and may sense data DQ based on the data strobe signal DQS.

The embodiment has illustrated and described the first data processing operation being the data masking operation, the second data processing operation being the data bus inversion operation, and the third data processing operation being the data strobe operation, but embodiments are not limited thereto. Different data processing operations may correspond to the first through third data processing operations.

The controller 100 includes a processing control element 110, an encoder 120, and a transmitter 130.

The processing control element 110 generates the data processing information prc for a processing operation of the data DQ, and provides the generated data processing information prc to the encoder 120.

The data processing information prc for the data bytes DQ1, DQ2, DQ3, . . . , DQn may be provided from the controller 100 to the operation unit 200 through separate connectors. However, when all the data processing information prc for the data bytes DQ1, DQ2, DQ3, . . . , DQn are provided through the separate connectors, it may be disadvantageous to miniaturization of the data processing apparatus 10.

In particular, when the data processing information prc has information for a plurality of data processing operations such as the above-described first through third data processing operations, a plurality of connectors may be used to transmit data processing information for each data byte. Therefore, the number of connectors is abruptly increased as an amount of transmission data is increased.

For example, when a data masking signal and a data strobe signal are provided with respect to the first data byte DQ1, the data masking signal and the data strobe signal are also both provided for the second data byte DQ2 and for the third data byte DQ3, respectively. A size of the data processing apparatus 10 is increased by connectors allocated to these signals as well as by a connection unit (for example, wire) that may connect the controller 100 and the operation unit 200.

In an embodiment, the processing control element 110 generates data processing information prc for each of the plurality of data bytes DQ1, DQ2, DQ3, . . . , DQn. In another embodiment, the processing control element 110 designates a data group that includes a plurality of data bytes processed by the same data processing information, and generates group data processing information gprc for a processing operation of the data group.

In an embodiment, the processing control element 110 determines a data group based on an externally received command. In another embodiment, the processing control element 110 analyzes characteristics of the data bytes DQ1, DQ2, DQ3, . . . , DQn, determines data bytes to be processed based on the same data processing information prc among the plurality of data bytes DQ1, DQ2, DQ3, . . . , DQn, and determines the data group accordingly.

Some data bytes of the plurality of data bytes DQ1, DQ2, DQ3, . . . , DQn may be allocated to a data group, and other data bytes of the plurality of data bytes DQ1, DQ2, DQ3, . . . , DQn may not be allocated to a data group. Therefore, the data processing information prc may include data processing information for each of the data bytes and group data processing information gprc for data group(s).

The processing control element 110 determines which connector to use to transmit the group data processing information gprc for the data group. The allocation of a connector to the group data processing information gprc may allocate as a representative connector one connector among the data processing information connectors associated with each of the plurality of data bytes included in the data group.

In the embodiment, the representative connector that may transmit/receive the group data processing information for the processing operation of the data group processed based on the same data processing information may be referred to as a unified connector.

The processing control element 110 generates the connector allocation information Casgn, including information for allocation of a unified connector, allocation of data to a data group, and data processing information. In some embodiments, the data processing apparatus 10 may further include a register 115 to store the connector allocation information Casgn. FIG. 1 shows the register 115 included in the processing control element 110, but the register 115 may be implemented external to the processing control element 110.

The encoder 120 encodes data based on the data processing information prc and the connector allocation information Casgn provided from the processing control element 110. The data bytes allocated to a data group are encoded based on the group data processing information gprc included in the data processing information prc. The encoder 120 provides the encoded data bytes to the transmitter 130.

The transmitter 130 provides the encoded data DQ, the data processing information prc, and the connector allocation information Casgn to the operation unit 200.

While FIG. 1 shows that the controller 100 includes the encoder 120 and the transmitter 130, the controller 100 may further include a receiver that receives certain data from the operation unit 200, and a decoder that decodes the received data so that the processing control element 110 may read out data recorded in the operation unit 200. In an embodiment, the encoder 120 and the decoder may be implemented in a single coding unit, and the transmitter 130 and the receiver may be implemented in a single transceiver.

The operation unit 200 may include a receiver 210, a register 220, and an operation element 230.

The receiver 210 may receive the data bytes DQ1, DQ2, DQ3, . . . , DQn, the data processing information prc, and the connector allocation information Casgn from the controller 100. In some embodiments, the receiver 210 may include a transmitter that transmits data received from the operation element 230 (that is, read out from the operation element 230) to the controller 100. In an embodiment, the transmitter and the receiver 210 may be implemented in a single transceiver.

When the receiver 210 transmits the data to the controller 100, the receiver 210 may provide the data processing information prc to the controller 100 based on the connector allocation information Casgn stored in the register 220.

The register 220 may receive the connector allocation information Casgn and store the received connector allocation information Casgn. The operation element 230 may identify through which connector the data processing information prc for decoding the data bytes DQ1, DQ2, DQ3, . . . , DQn is received based on the connector allocation information Casgn stored in the register 220, and decode the received data.

The operation element 230 may include a memory that may store the data bytes DQ1, DQ2, DQ3, . . . , DQn, and circuits to perform various operations. For example, the operation element 230 may include a volatile memory and/or a non-volatile memory, and include circuits suitable for write and read-out of data.

The operation element 230 may decode the received data based on the data processing information prc, and store the decoded data. The operation element 230 may include a plurality of memory cells configured to store the decoded data. Further, the operation element 230 may read out stored data, generate data processing information prc according to connector allocation information Casgn, and encode the read data. The encoded information and the data processing information prc may be transmitted to the controller 100 through a transmitter that in an embodiment may be implemented with the receiver 210 as a single transceiver.

Figure 2:
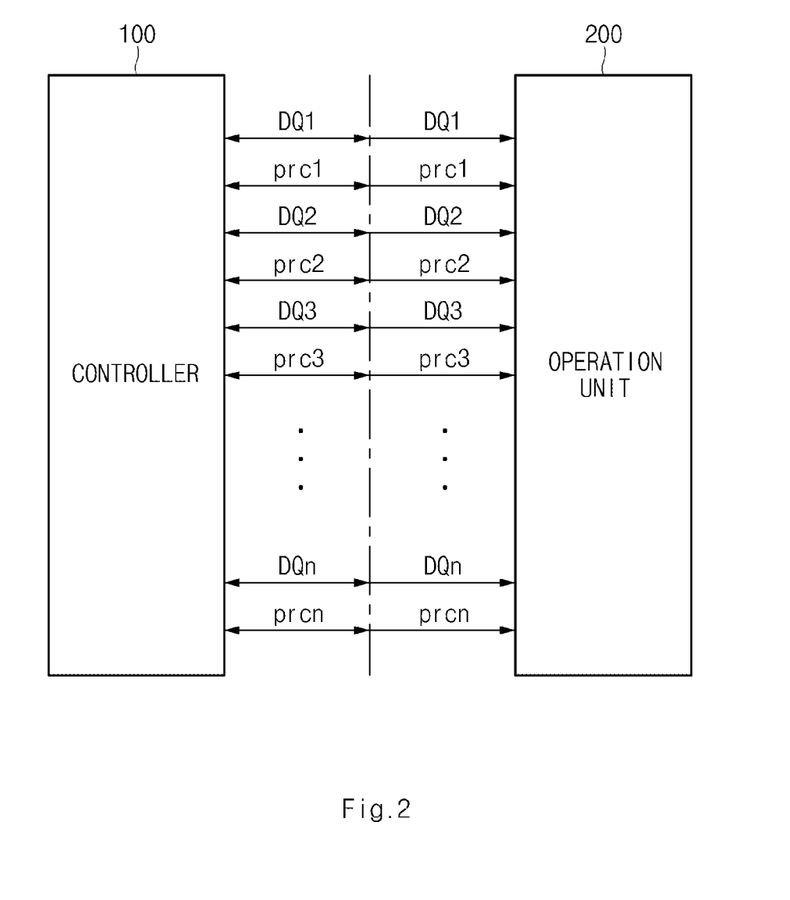
FIG. 2 is a conceptual diagram explaining a case in which connectors are allocated one to one according to the related method when information is transmitted/received between a controller and an operation unit.

FIG. 2 is a conceptual diagram explaining a case in which connectors are allocated one-to-one according to the related method when information is transmitted/received between a controller and an operation unit. An arrow in FIG. 2 may represent conceptual transmission of an electrical signal as well as representing a physical connector.

Referring to FIG. 2, first data byte DQ1 and first data processing information prc1, second data byte DQ2 and second data processing information prc2, third data byte DQ3 and third data processing information prc3, and n-th data byte DQn and n-th data processing information prcn are paired to each other, respectively, and provided through separate connectors.

The first data byte DQ1 is data-processed based on the first data processing information prc1, and the operation unit 200 may decode the first data byte DQ1 based on the first data processing information prc1 received through a separate connector.

When data processing information is allocated to each data byte, as illustrated in FIG. 2, as the number of data bytes is increased, the number of connectors to be allocated is increased when a plurality of data processing information are provided with respect to each data byte (for example, when both a data strobe signal and a data masking signal are provided with respect to a data byte).

Further, in FIG. 2, a boundary between the controller 100 and the operation unit 200 is indicated by a one-dot chain line. Pins that may provide the data bytes DQ1, DQ2, DQ3, . . . , DQn and pins that may provide data processing information (prc1, prc2, prc3, . . . , prcn) exist in the controller 100, and pins that receives the data bytes and the data processing information exist in the operation unit 200.

In some embodiments, the controller 100 and the operation unit 200 may be mounted on a printed circuit board (PCB) in a chip form including pins that may transmit and/or receive signals. The pins of the controller 100 and the operation unit 200 may be coupled through an electrical connection such as an electrical wire (wiring) on the PCB at the boundary indicated by the one-dot chain line. The embodiment shows the pins as a connection unit, but any component that may transmit the signal between the controller 100 and the operation unit 200 may be used as the connection unit. In the embodiment, the connection unit may be referred to as a connector.

Figure 3:
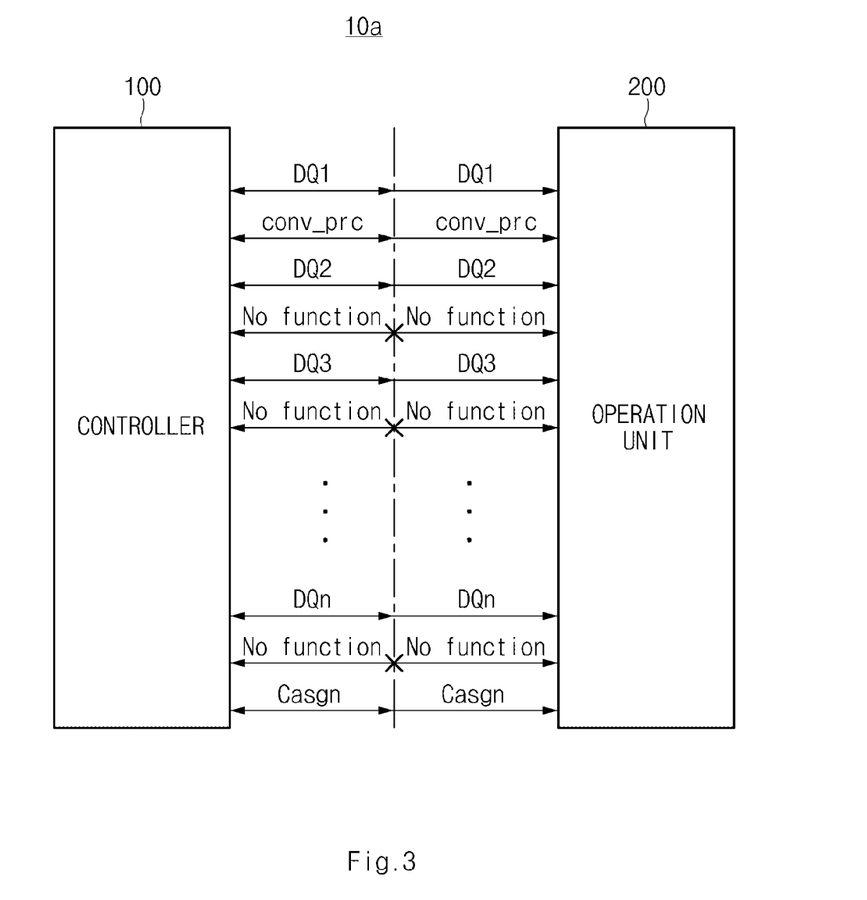
FIG. 3 is a view illustrating a connector between a controller and an operation unit according to an embodiment.

FIG. 3 is a view illustrating an embodiment in which data bytes processed based on the same data processing information are allocated to a data group, and the data processing information for the data group is transmitted and/or received as group data processing information through a single connector allocated to the group data processing information, in order to reduce the need for the plurality of connectors as described with respect to FIG. 2.

An arrow in FIG. 3 may indicate transmission of a conceptual signal and/or may indicate a physical connector.

Referring to FIG. 3, the controller 100 of a data processing apparatus 10a provides first through n-th data bytes DQ1, DQ2, DQ3, . . . , DQn to the operation unit 200. As described in FIG. 2, the first through n-th data bytes DQ1, DQ2, DQ3, . . . , DQn may be provided to the operation unit 200 from the controller 100 through connectors, and the controller 100 and the operation unit 200 may be electrically coupled at the boundary indicated by a one-dot chain line.

The processing process element 110 included in the controller 100 as illustrated in FIG. 1 may determine a data group based on an externally received command, or the processing control element 110 may analyze the first through n-th data bytes DQ1, DQ2, DQ3, . . . , DQn, and determine the data group that may be processed based on the same data processing information.

For example, when the data processing information prc includes information related to the data masking operation, the processing control element 110 may determine that currently provided first through n-th data bytes DQ1, DQ2, DQ3, . . . , DQn are the same as just previously provided first through n-th data bytes DQ1, DQ2, DQ3, . . . , DQn, and thus all the data bytes are to be processed using the data masking operation. Alternatively, the processing control element 110 may determine that all the currently provided first through n-th data bytes DQ1, DQ2, DQ3, . . . , DQn are different from just previously provided first through n-th data bytes DQ1, DQ2, DQ3, . . . , DQn, and thus the data bytes are not to be processed using the data masking operation. However, when some but not all of the data bytes are to be processed using the data masking operation, only the data bytes that are to be processed using the data masking operation may be allocated to a data group.

In other embodiments, when the data processing information prc includes information related to the data bus inversion operation, the data bus inversion operation has to be performed on all the data bytes when it is determined that the number of "1" included in each of the first through n-th data bytes DQ1, DQ2, DQ3, . . . , DQn is equal to or larger than a preset number. However, when it is determined that the number of "1" is less than the preset number, the data bus inversion operation may not be performed. Similarly, only some of the data bytes may be allocated to the data group.

As described above, the processing control element 110 may analyze data processing characteristics for the plurality of data bytes DQ1, DQ2, DQ3, . . . , DQn, and determine a data group processed based on the same data processing information.

In FIG. 3, a command may be received from the outside allocating all the plurality of data bytes DQ1, DQ2, DQ3, . . . , DQn to the data group, or the processing control element 110 may analyze the characteristics of the plurality of data bytes DQ1, DQ2, DQ3, . . . , DQn and allocate all of the data bytes to the data group accordingly.

According to the determination of the data group, the data processing information for all the data bytes DQ1, DQ2, DQ3, . . . , DQn are generated as the group data processing information gprc.

The group data processing information gprc with respect to the data group may be transmitted through one connector among the plurality of connectors originally allocated to transmit data processing information.

Like the determination of the data group, the unified connector may be allocated based on an external command or the allocation of the unified connector may be performed based on a determination of the data group by the processing control element 110. In some embodiments, the allocation of the unified connector may change during the operation process.

The information related to the data group and the unified connector may be stored in the controller 100 and the operation unit 200 as the connector allocation information Casgn.

Table 1 below illustrates the connector allocation information Casgn generated by the processing control element 110 according to an embodiment.

For example, the connector allocation information Casgn may include first connector allocation information indicating a data group processed based on the same data processing information, and second connector allocation information indicating which connector the data processing information of the data group is transmitted/received through.

TABLE 1

|  | characteristic |
|---|---|
| First connector allocation information | Indication of data group |
| Second connector allocation information | Indication of unified connector |

For example, the processing control element 110 may generate the first connector allocation information having a value of 01110110 based on an externally received command or by analyzing first to eighth data bytes DQ1, DQ2, DQ3, DQ4, DQ5, DQ6, DQ7, and DQ8.

Figure 4:
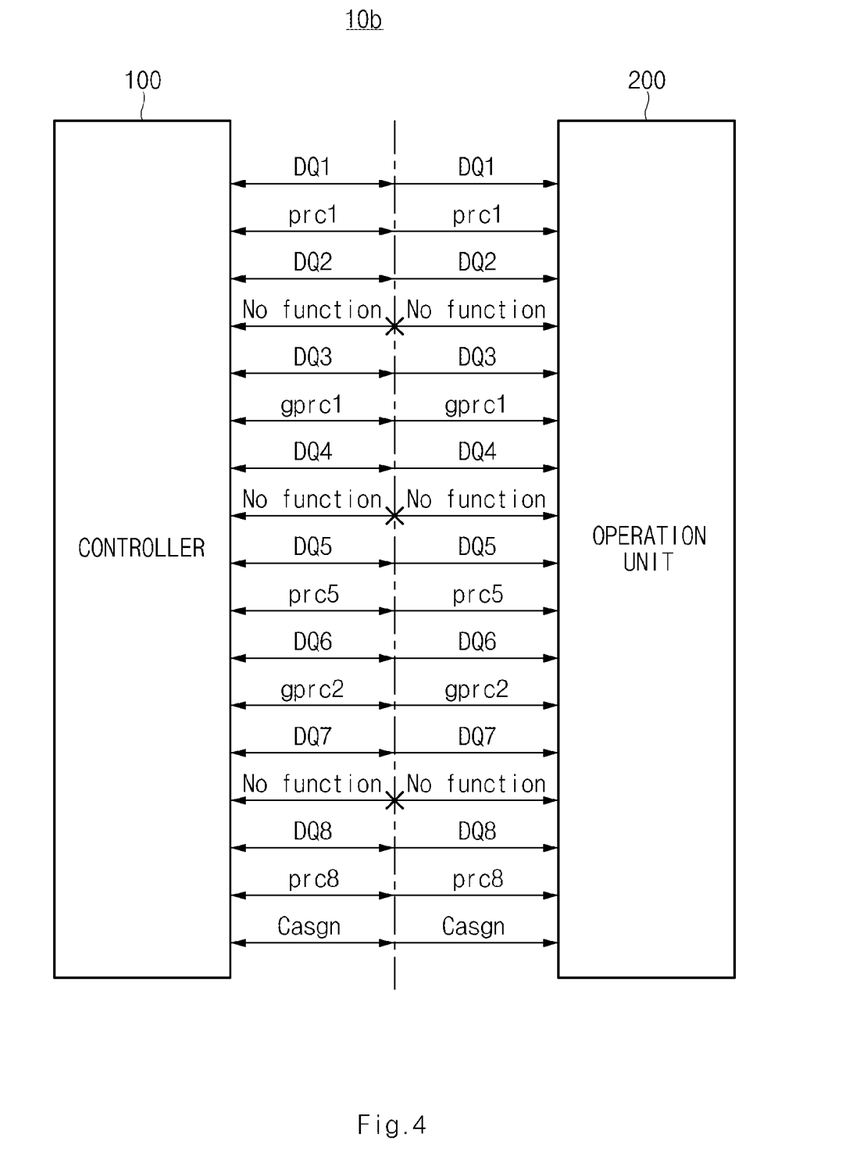
FIG. 4 is a view illustrating a data processing apparatus according to connector allocation information according to an embodiment.

FIG. 4 illustrates a data processing apparatus 10b according to an example of the first connector allocation information. Hereinafter, the data processing apparatus 10b will be described with reference to FIG. 4.

Each bit 1 through 8 of the first connector allocation information indicates whether the corresponding one of the first through eighth data bytes DQ1 through DQ8 are in a data group. First data byte DQ1, fifth data byte DQ5, and eighth data byte DQ8 having the value of "0" in the corresponding bits of the first connector allocation information are not included in the data group, and each of the first data byte DQ1, the fifth data byte DQ5, and the eighth data byte DQ8 is processed according to its own data processing information. Therefore, first data processing information prc1, fifth data processing information prc5, and eighth data processing information prc8 are provided from the controller 100 to the operation unit 200. As described above, the controller 100 and the operation unit 200 are electrically coupled in a region divided by a one-dot chain line and thus data and data processing information may be transmitted and received thereby.

Data bytes having the value of "1" are allocated to one or more data groups. Second data to fourth data bytes DQ2, DQ3, and DQ4 adjacent to each other and each having the value of "1" in the corresponding bit of the first connector allocation information are allocated to a first data group, and sixth data byte DQ6 and seventh data byte DQ7 adjacent to each other and each having the value of "1" in the corresponding bit of the first connector allocation information are allocated to a second data group, and the data bytes allocated to the first and second data groups are processed according to their respective same data processing information.

The processing control element 110 generates first group data processing information gprc1 with respect to the second data through fourth data bytes DQ2, DQ3, and DQ4 allocated to the first data group, and further determines a unified connector through which to transmit and/or receive the first group data processing information gprc1. In an embodiment, the allocation of the unified connector may be externally determined and the result of the determination is provided to the controller 100.

For example, the unified connector for the first group data processing information gprc1 may be allocated to one connector from among the connectors through which the second data processing information, the third data processing information, and the fourth data processing information would be provided for the second data byte through fourth data byte DQ2, DQ3, and DQ4, respectively.

Similarly, a unified connector is allocated to second group data processing information gprc2 associated with the second data group which including the sixth data byte DQ6 and seventh data byte DQ7. The unified connector with respect to the first data group will be referred to as a first unified connector, and the unified connector with respect to the second data group will be referred to as a second unified connector.

The processing control element 110 may externally receive the second connector allocation information, for example, of X010X10X, or may internally generate the second connector allocation information. An "X" indicates a "don't care" value with respect to the first data byte DQ1, the fourth data byte DQ4, and the eighth data byte DQ8, each of which are not allocated to any data group.

A third data processing information connector that may already exist to transmit/receive the data processing information of the third data byte DQ3 is allocated as the first unified connector with respect to the first data group including the second through fourth data byte DQ2, DQ3, and DQ4, according to the third bit of the second connector allocation information, and a sixth data processing information connector that may already exist to transmit/receive the data processing information of the data DQ6 is allocated as the second unified connector with respect to the second data group including the sixth data byte DQ6 and the seventh data byte DQ7 according to a sixth bit of the second connector allocation information.

According to the allocation of the unified connectors, data processing information connectors that may exist to transmit/receive second data processing information, fourth data processing information, and seventh data processing information may not have to transmit/receive the data processing information (that is, they have "no function"). Since the connectors do not transmit/receive the data processing information, the connectors may not be electrically coupled between the controller 100 and the operation unit 200 at the boundary indicated by a one-dot chain line. In FIG. 4, electrical disconnections between the controller 100 and the operation unit 200 are indicated by an "X". Since the disconnected electrical connections may be omitted, a size of the data processing apparatus 10b may be reduced.

In other embodiments, a connector of the controller 100 and the operation unit 200 designated as having "no function" in FIG. 4 may be set to transmit/receive signals other than data processing information. When the connectors are set to perform other functions, the connectors may be electrically coupled at the boundary indicated by the one-dot chain line.

An example of the connector allocation information Casgn has been described above, but embodiments are not limited thereto, and any connector allocation information, which has a structure to indicate an allocation of data to data groups and to indicate a unified connector that may transmit/receive unified data processing information for the data groups, may be implemented by various embodiments.

Figure 5:
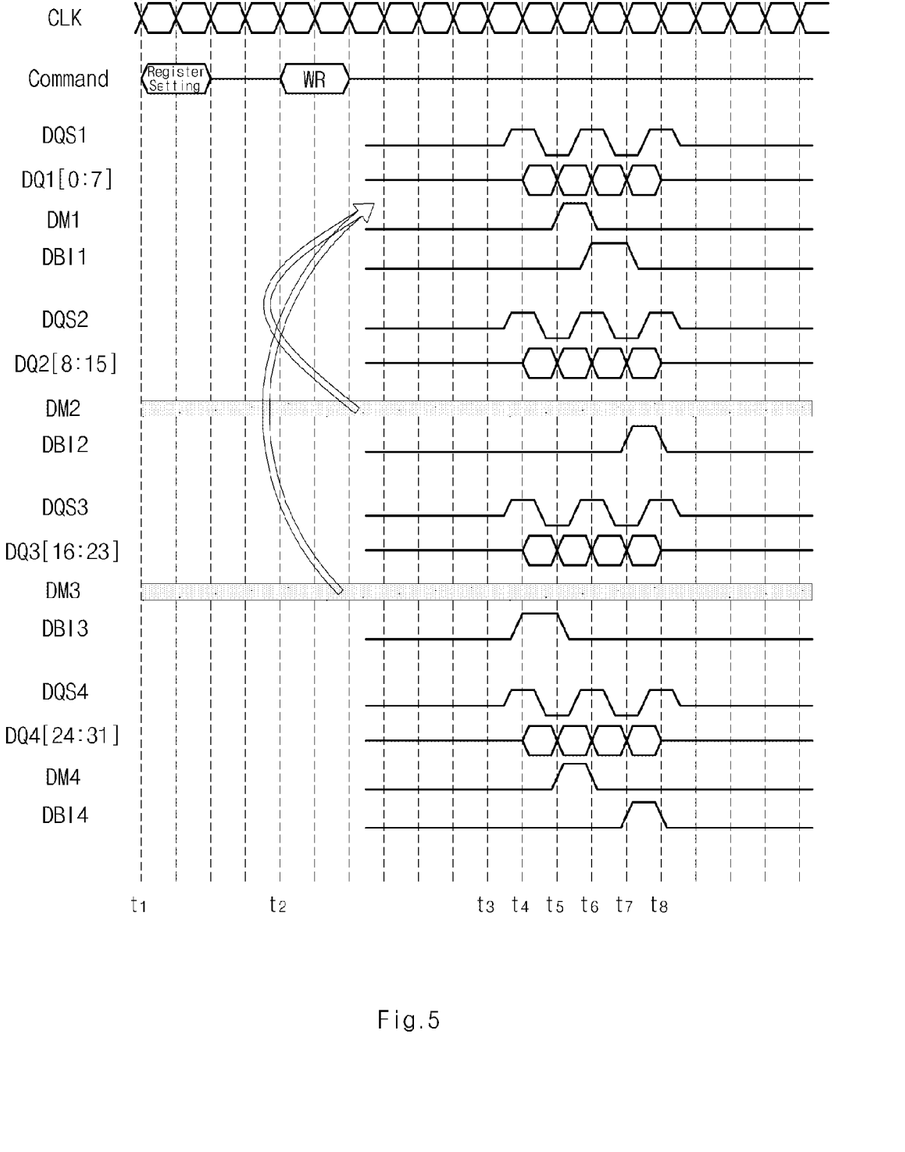
FIG. 5 is a waveform diagram explaining a data processing operation according to an embodiment.

FIG. 5 is a waveform diagram explaining a data processing operation according to an embodiment.

FIG. 5 shows an embodiment in which data processing information includes a data strobe operation, a data masking operation, and a data bus inversion operation. Data masking signals DM1 through DM4 are associated with the data masking operation, and data bus inversion signals DBI1 through DBI4 are associated with the data bus inversion operation.

Referring to FIG. 5, the controller 100 generates connector allocation information Casgn at a first point in time t1, and sets the register 115 of the controller 100 and the register 220 of the operation unit 200 (Register Setting). The controller 100 may generate the connector allocation information Casgn based on an external command.

In some embodiments, a data group may be determined and the allocation of a unified connector may be performed through analysis of data DQ, and the connector allocation information Casgn may be generated according to the results of the analysis. When this occurs, the register setting may be performed at a time after the first point in time t1 shown in FIG. 5.

The controller 100 may provide a command signal that indicates that a write or read operation is to be performed to the operation unit 200 at a point in time t2. In relation to FIG. 5, a write operation that writes data DQ in the operation unit 200 by providing the data DQ from the controller 100 will be described.

In relation to FIG. 5, a case will be described in which first data byte DQ1, second data byte DQ2, and third data byte DQ3 are assigned to a data group, and a connector that may transmit a data masking signal for the first data byte DQ1 is allocated as a unified connector.

The controller 100 provides data strobe signals DQS1, DQS2, DQS3, and DQS4 for the data bytes DQ1, DQ2, DQ3, and DQ4, respectively, to the operation unit 200 through separate connectors.

The processing control element 110 generates unified data processing information with respect to a data group including the first through third data bytes DQ1, DQ2, and DQ3. The unified data processing information corresponds to the first data masking signal DM1.

The processing control element 110 provides connector allocation information Casgn to the encoder 120 indicating that first through third data bytes DQ1, DQ2, and DQ3 are to be processed according to the first data masking signal DM1.

The encoder 120 performs data processing (that is, encoding) on the first through third data bytes DQ1, DQ2, and DQ3 based on the first data masking signal DM1. The first through fourth data bytes DQ1, DQ2, DQ3, and DQ4 as processed based on the data processing signals in the encoder 120 may be provided to the operation unit 200 in synchronization with the data strobe signals DQS1, DQS2, DQS3, and DQS4.

FIG. 5 illustrates an operation in which the data bytes DQ1, DQ2, DQ3, and DQ4 of 8 bits each are provided from a fourth point in time t4 to a fifth point in time t5, from the fifth point in time t5 to a sixth point in time t6, from the sixth point in time t6 to a seventh point in time t7, and from a seventh point in time t7 to an eighth point in time t8. That is, the data of 32 bits processed through the encoder 120 is provided to the operation unit 200 by 8 bits in each section.

The encoder 120 performs masking processing on all the first through third data bytes DQ1, DQ2, and DQ3 based on the first data masking signal DM1. Therefore, the encoder 120 performs mask processing in the first through third data bytes DQ1, DQ2, and DQ3 provided from the fifth point in time t5 to the sixth point in time t6, and the encoder 120 does not perform masking processing on the first through third data bytes DQ1, DQ2, and DQ3 provided from the fourth point in time t4 to the fifth point in time t5, from the sixth point in time t6 to the seventh point in time t7, and from the seventh point in time t7 to the eighth point in time t8.

In addition to showing a data masking operation, FIG. 5 also shows a data bus inversion operation being performed. The encoder 120 may process the first through fourth data bytes DQ1, DQ2, DQ3, and DQ4 according to the first through fourth data bus inversion signals DBI1, DBI2, DBI3, and DBI4, respectively.

In brief, the first data byte DQ1 may be masking-processed based on the first data masking signal DM1 and provided through a connector allocated to the first data byte DQ1 at the fifth point in time t5, and the first data byte DQ1 may be inversion-processed based on the first data bus inversion signal DBI1 and provided through the same connector at the sixth point in time t6.

The first data byte DQ1 may be provided in synchronization with the first data strobe signal DQS1. Further, the first data masking signal DM1 and the first data bus inversion signal DBI1 may be separately provided to the operation unit 200 through allocated connectors.

The second data byte DQ2 may be masking-processed based on the first data masking signal DM1 and provided in synchronization with the second data strobe signal DQS2 at the fifth point in time t5. The second data byte DQ2 may be inversion-processed based on the second data bus inversion signal DBI2 and provided in synchronization with the second data strobe signal DQS2 at the seventh point in time t7.

The third data byte DQ3 may be inversion-processed based on the third data bus inversion signal DBI3 and provided in synchronization with the third data strobe signal DQS3 at the fourth point in time t4. The third data byte DQ3 may be masking-processed based on the first data masking signal DM1 and provided in synchronization with the third strobe signal DQS3 at the fifth point in time t5.

The data masking operations for the second data byte DQ2 and the third data byte DQ3 are performed based on the first data masking signal DM1, and thus at least two connectors for the second data byte DQ2 and the third data byte DQ3 necessary in the related art may be omitted.

The fourth data byte DQ4 may be masking-processed based on the fourth data masking signal DM4 and provided in synchronization with the fourth data strobe signal DQS4 at the fifth point in time t5. The fourth data byte DQ4 may be inversion-processed based on the fourth data bus inversion signal DBI4 and provided in synchronization with the fourth data strobe signal DQS4 at the seventh point in time t7

Therefore, the second data masking signal DM2 and the third data masking signal DM3 are determined to have the same signal as the first masking signal DM1, and thus the second and third data masking signals DM2 and DM3 are not provided from the controller 100 to the operation unit 200.

When the operation unit 200 receives the signals as illustrated in FIG. 5 from the controller 100, the operation unit 200 may identify that the first through third data bytes DQ1, DQ2, and DQ3 form a data group based on connector allocation information Casgn, and that the first data masking signal DM1 provided through the unified connector is being used as the group data processing information.

Therefore, the operation element 230 of the operation unit 200 may decode portions of received data based on the connector allocation information Casgn stored in the register 220, and the operation unit 200 may thereby determine whether data provided at a specific point in time is inverted or masked.

As described above, the data processing apparatus according to an embodiment may determine a data group using the same data processing information and transmit the data processing information for the data group through one unified connector to reduce a size thereof.

Further, the data processing method according to an embodiment may process a plurality of data groups and data transferred via a connector based on the data processing information transmitted using a simple configuration so that the method may be advantageously used in a small electronic apparatus to perform a high-speed operation.

The embodiments described above and in the accompanying drawings are illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A data processing apparatus comprising:
a controller configured to provide, through a unified connector, group data processing information for a processing operation of a data group processed based on the same data processing information, the data group comprising a plurality of data transmitted or received through a plurality of connectors; and
an operation unit configured to decode the data group based on the group data processing information,
wherein the controller includes:
a processing control element configured to generate the group data processing information and connector allocation information indicating the unified connector;
an encoder configured to encode the data group based on the connector allocation information and the group data processing information; and
a transmitter configured to transmit the encoded data group through the plurality of connectors, and transmit the group data processing information through the unified connector, and
wherein the controller further includes a register configured to store the connector allocation information.

2. The data processing apparatus of claim 1, wherein the processing control element determines the data group by analyzing characteristics of the plurality of data.

3. The data processing apparatus of claim 1, wherein the processing control element generates the connector allocation information based on an externally received command.

4. The data processing apparatus of claim 1, wherein the operation unit includes a plurality of memory cells configured to store decoded data.

5. The data processing apparatus of claim 1, wherein the operation unit includes an operation element configured to decode the data group received from the controller based on the group data processing information.

6. The data processing apparatus of claim 5, wherein the operation unit includes a register configured to receive and store the connector allocation information from the controller, and the operation unit determines, using the connector allocation information, whether data received from a specific connector is included in the data group and the group data processing information.

7. The data processing apparatus of claim 1, wherein the group data processing information for the data group includes information for the processing operation of the data group, and the processing operation includes at least one of a data masking operation, a data bus inversion operation, and a data strobe operation.

8. A data processing method comprising:
generating, by a data transmitter, connector allocation information and group data processing information for a processing operation of a data group processed based on the same data processing information, the data group comprising a plurality of data transmitted or received through a plurality of connectors;
storing, by the data transmitter, the connector allocation information in a register;
determining, by a data receiver, the group data processing information for the data group based on the connector allocation information;
encoding, by the data transmitter, the data group based on the connector allocation information and the group data processing information; and
transmitting, by the data transmitter, the encoded data group through the plurality of connectors based on the connector allocation information and providing the group data processing information through a unified connector.

9. The data processing method of claim 8, further comprising determining, by the data transmitter, the data group by analyzing characteristics of the plurality of data.

10. The data processing method of claim 8, wherein the data processing information for the plurality of data includes information related to one or more of a data masking operation, a data bus inversion operation, and a data strobe operation.

11. The data processing method of claim 8, further comprising:
decoding, by the data receiver, the encoded data group based on the group data processing information.

* * * * *